United States Patent [19]
Rao et al.

[11] Patent Number: 5,514,612
[45] Date of Patent: May 7, 1996

[54] METHOD OF MAKING A SEMICONDUCTOR DEVICE WITH INTEGRATED RC NETWORK AND SCHOTTKY DIODE

[75] Inventors: Bhasker Rao, Chandler; Horst Leuschner, Scottsdale, both of Ariz.; Ashok Chalaka, San Jose, Calif.

[73] Assignee: California Micro Devices, Inc., Milpitas, Calif.

[21] Appl. No.: 282,033

[22] Filed: Jul. 28, 1994

Related U.S. Application Data

[63] Continuation-in-part of Ser. No. 25,600, Mar. 3, 1993, Pat. No. 5,355,014.

[51] Int. Cl.$^6$ .................... H01L 21/265; H01L 21/70; H01L 27/00
[52] U.S. Cl. .................... 437/51; 437/39; 437/54; 437/60; 437/47; 437/904; 437/912; 437/919
[58] Field of Search .................... 437/60, 51, 39, 437/54, 904, 918, 919, 47, 192, 193; 257/355, 358, 359, 360, 363, 516, 528, 532, 533, 536, 537, 538; 361/91

[56] References Cited

U.S. PATENT DOCUMENTS

| | | | |
|---|---|---|---|
| 3,864,817 | 2/1975 | Lapham, Jr. et al. | 437/60 |
| 3,907,617 | 9/1975 | Zwernemann | 437/904 |
| 4,001,869 | 1/1977 | Brown | 437/60 |
| 4,578,695 | 3/1986 | Delaporte et al. | 257/533 |
| 4,871,686 | 10/1989 | Davies | 437/39 |
| 4,890,187 | 12/1989 | Tailliet et al. | 361/91 |
| 4,937,639 | 6/1990 | Yao et al. | 257/359 |
| 4,948,747 | 8/1990 | Pfiester | 437/60 |
| 5,013,677 | 5/1991 | Hozumi | 437/918 |
| 5,018,000 | 5/1991 | Yamada et al. | 257/532 |
| 5,081,473 | 1/1992 | Hawkins et al. | 347/59 |
| 5,284,794 | 2/1994 | Isobe et al. | 437/918 |

*Primary Examiner*—Mary Wilczewski
*Assistant Examiner*—Brian K. Dutton
*Attorney, Agent, or Firm*—Flehr, Hohbach, Test, Albritton & Herbert

[57] ABSTRACT

A semiconductor device which has a resistor, a capacitor, a Schottky diode, and an ESD protection device all formed on a single semiconductor substrate. The resistor and the capacitor are coupled together in series. The Schottky diode and the ESD protection device are coupled in parallel to the series connection of the resistor and capacitor.

30 Claims, 11 Drawing Sheets

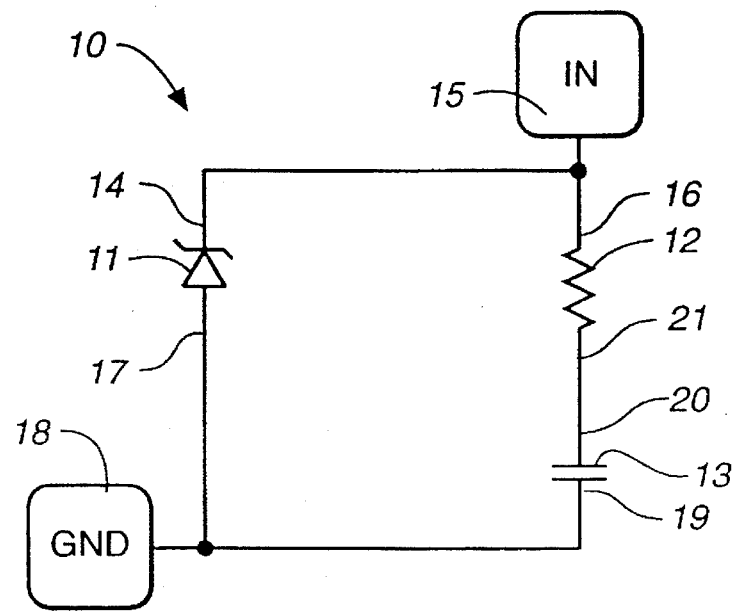
FIG._1
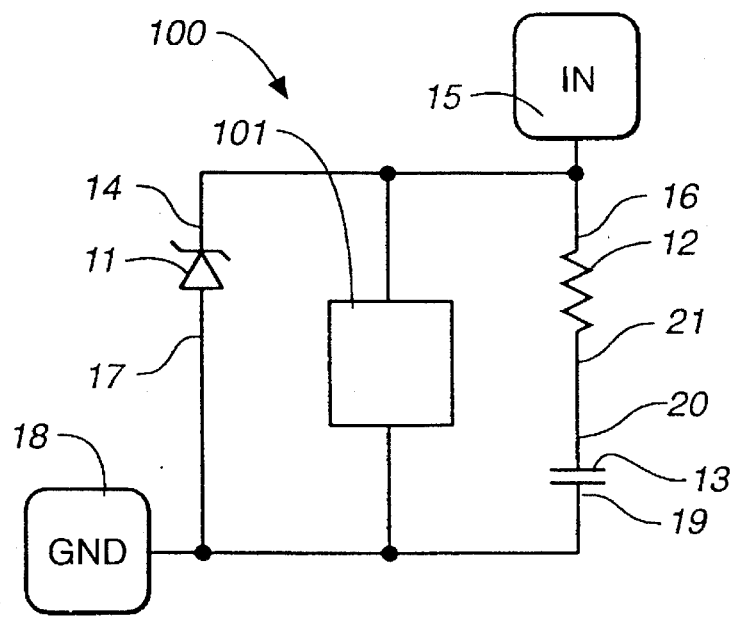
FIG._6

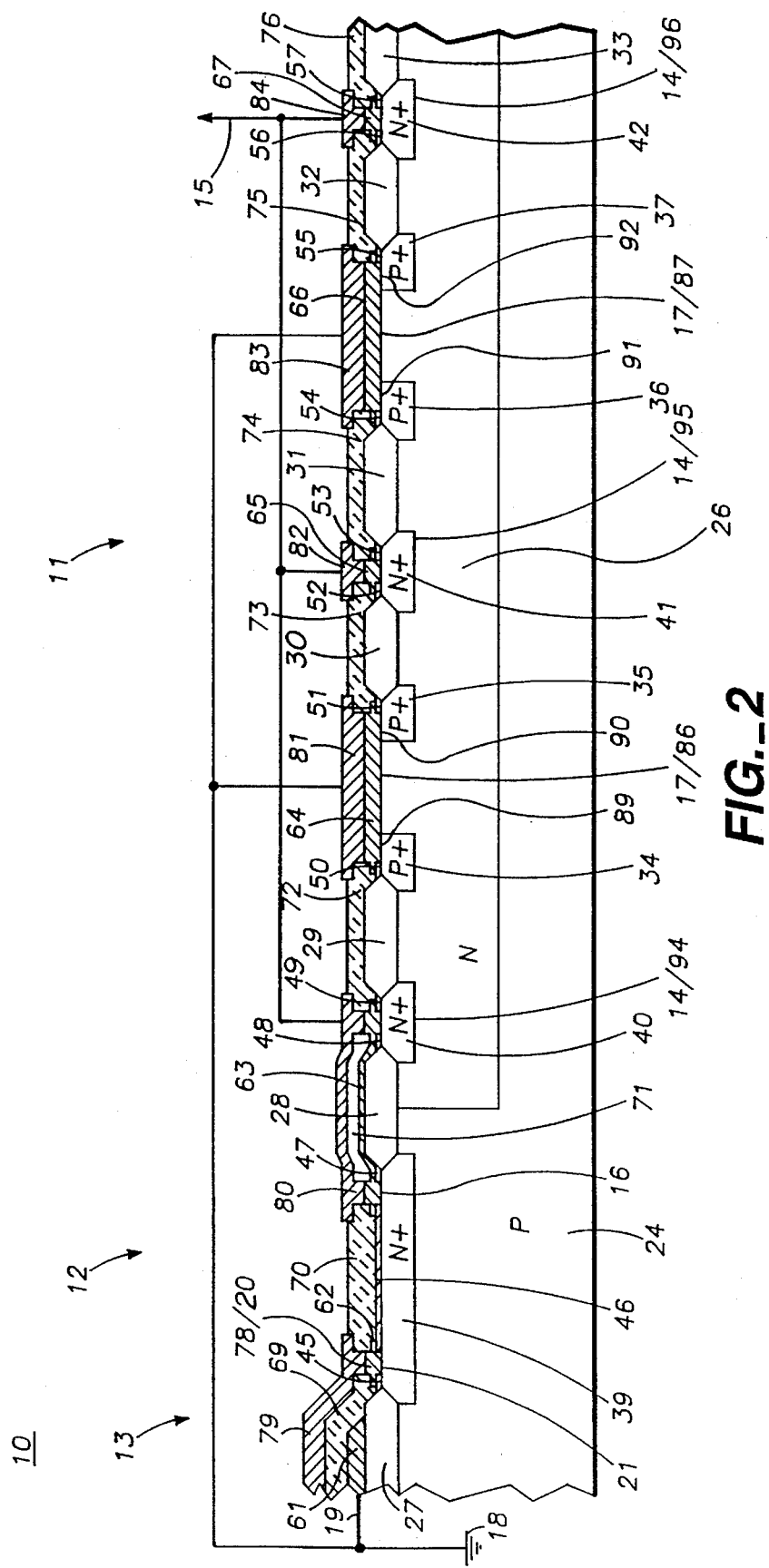
FIG._2

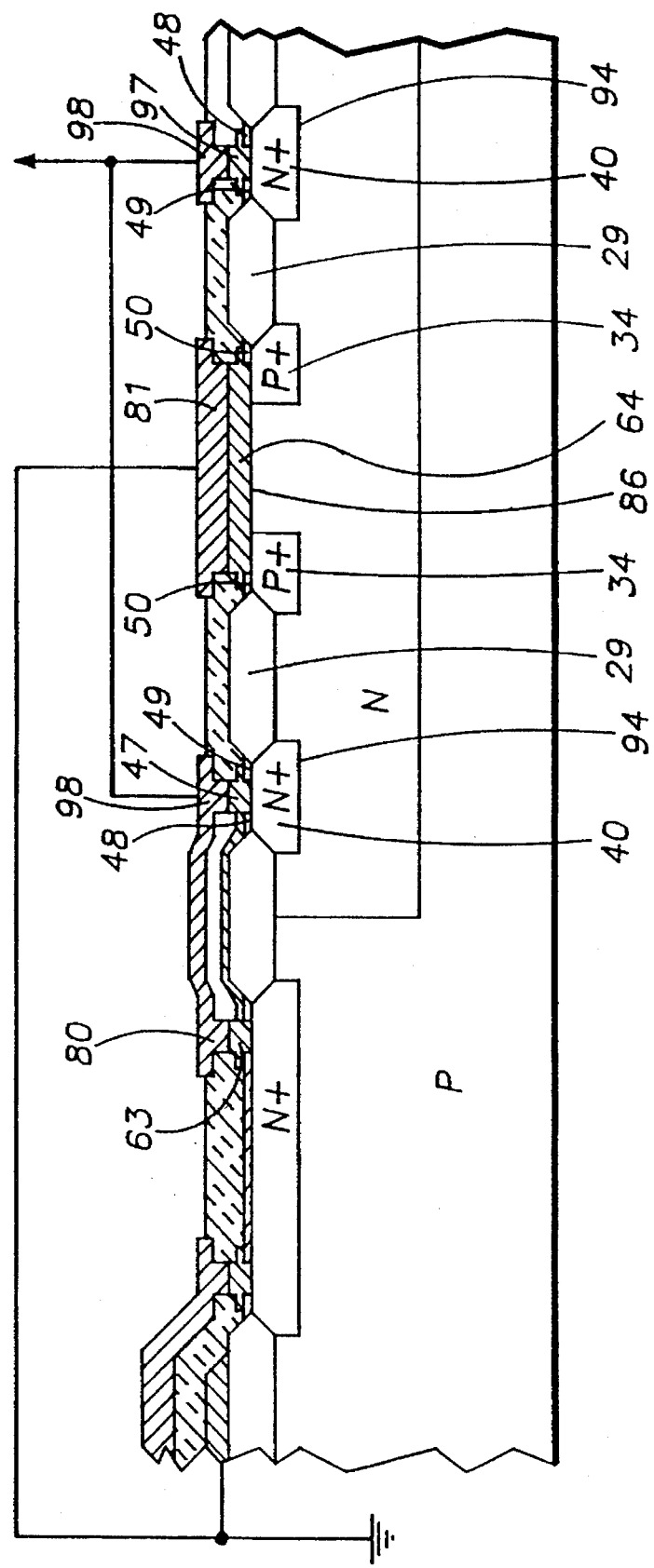
FIG._3

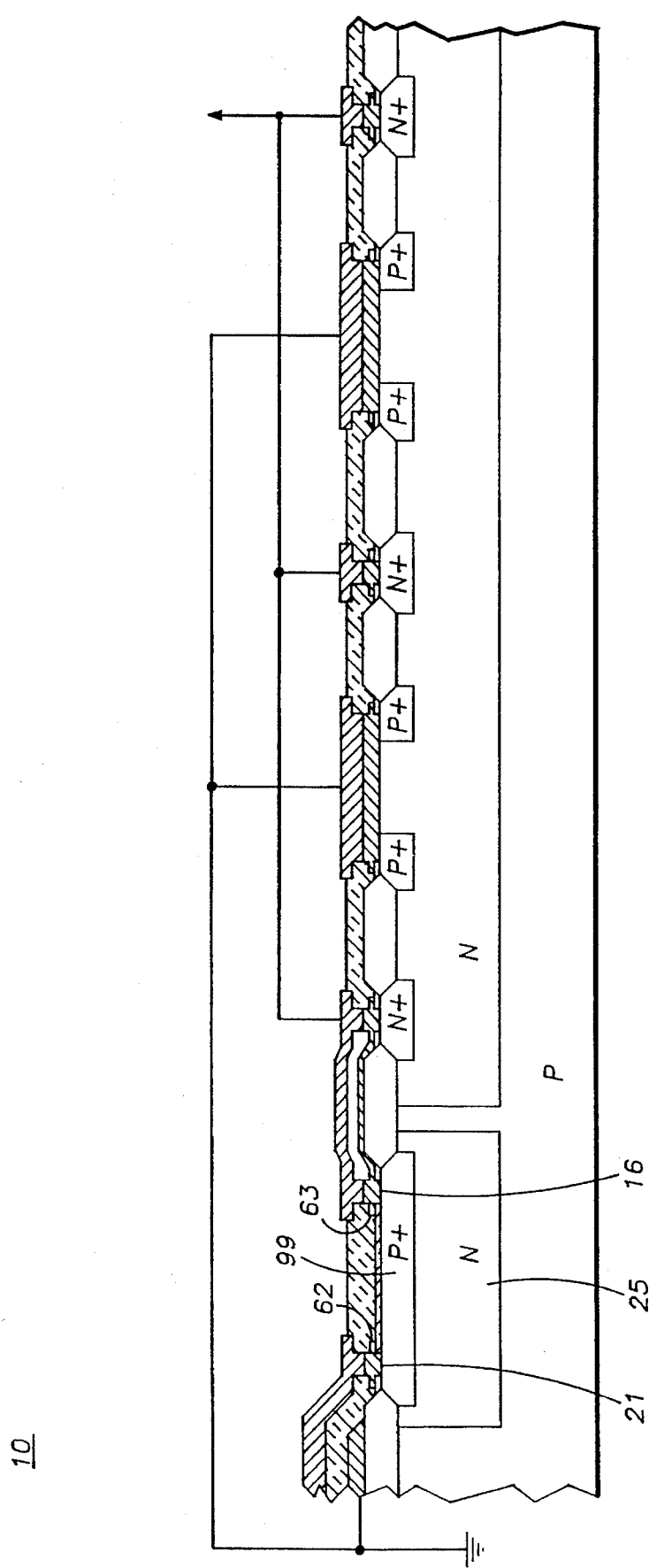
FIG._4

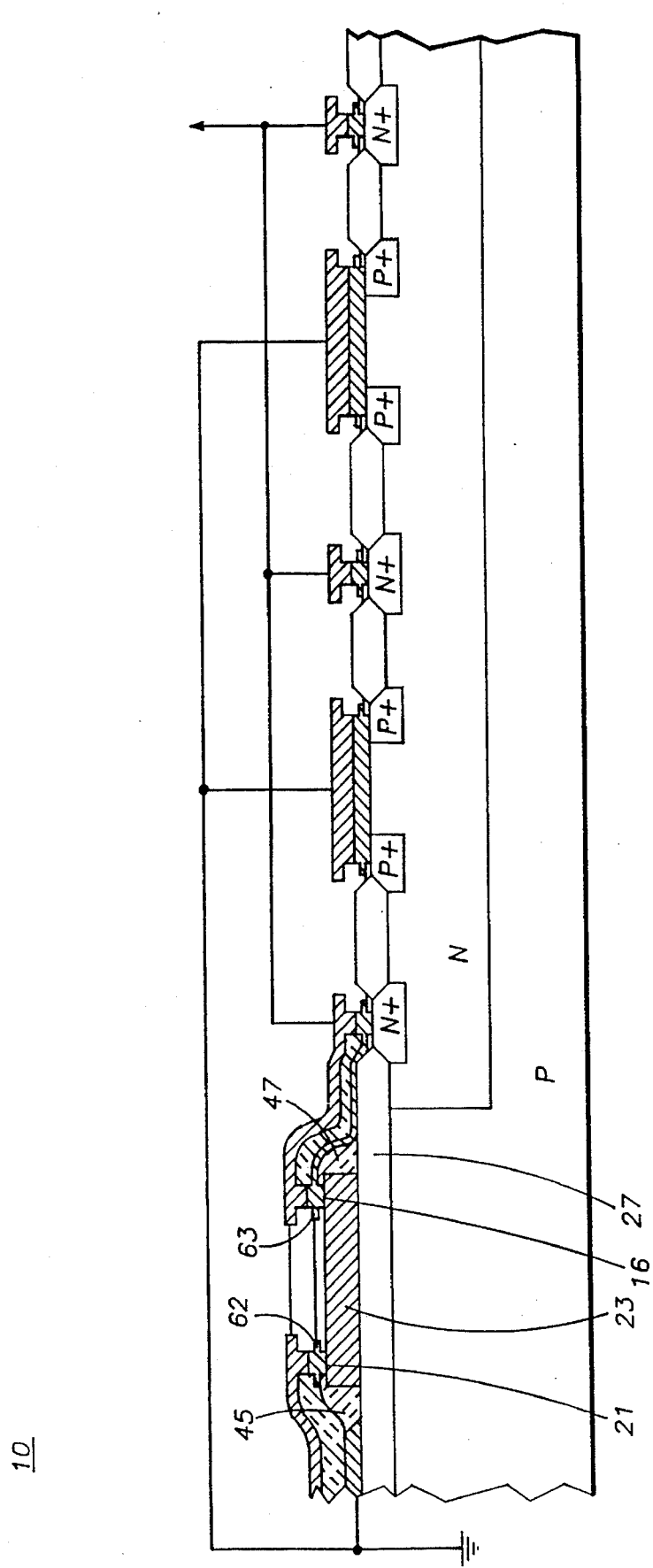
FIG._5

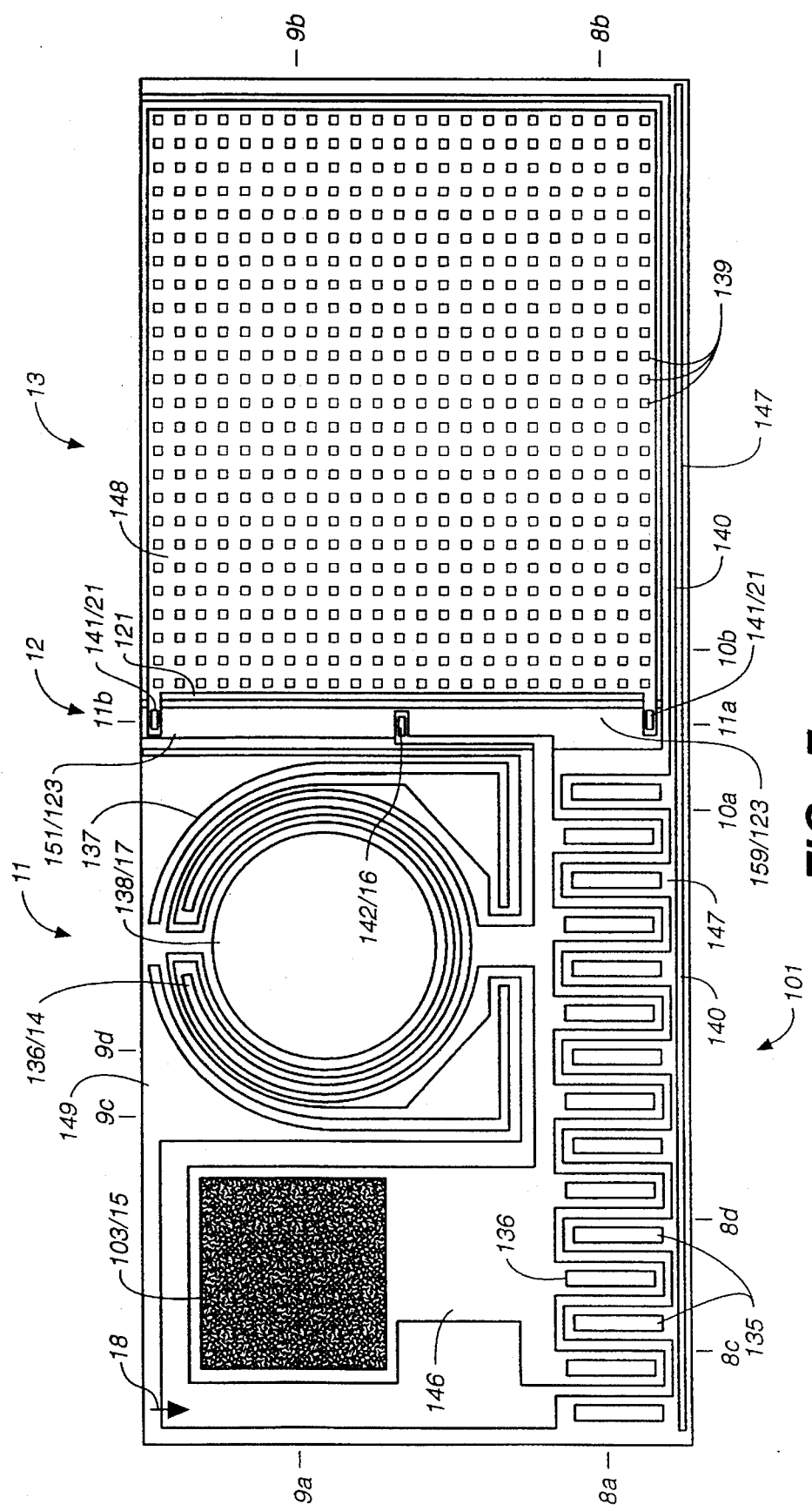
FIG._7

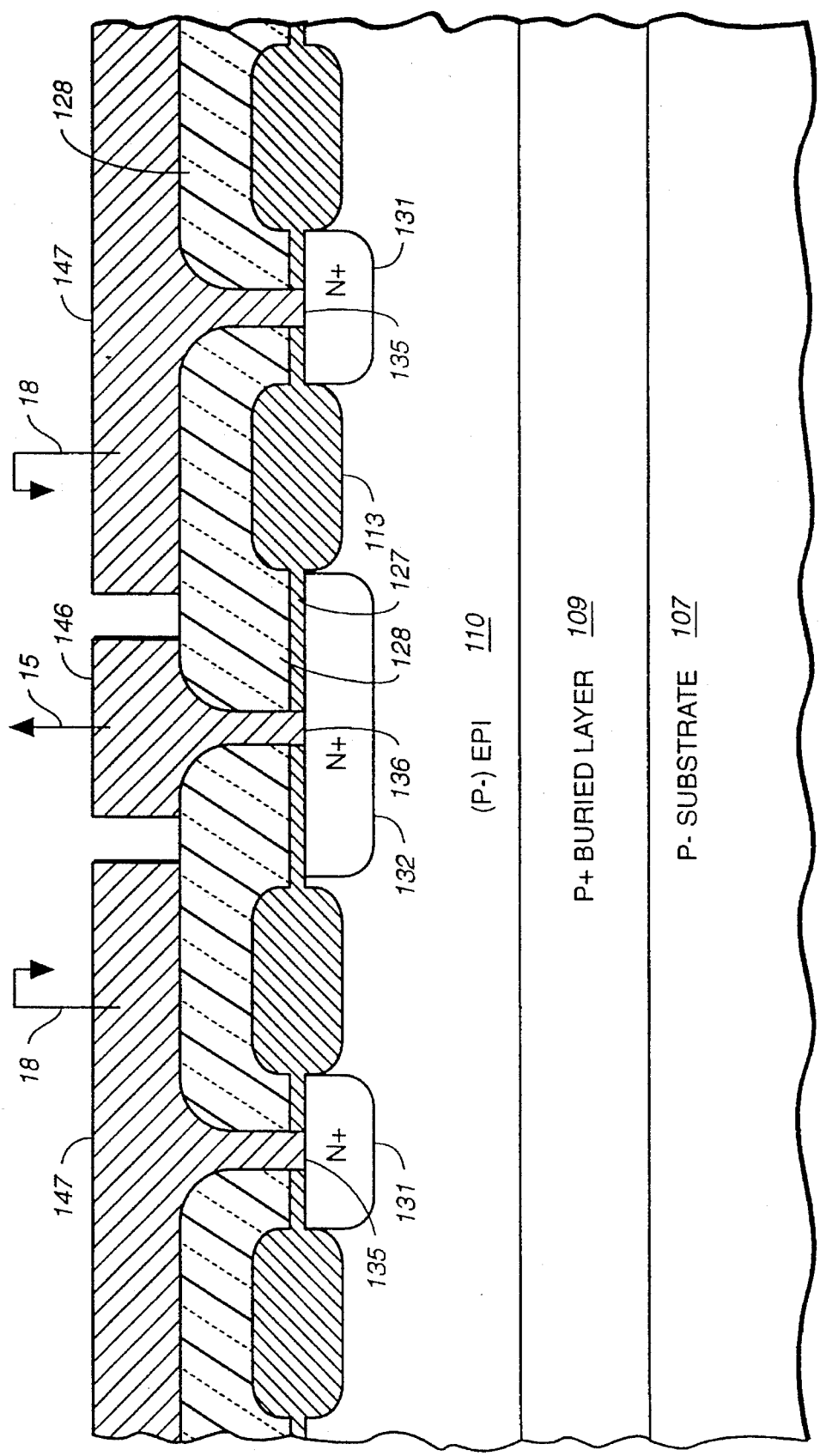
FIG._8

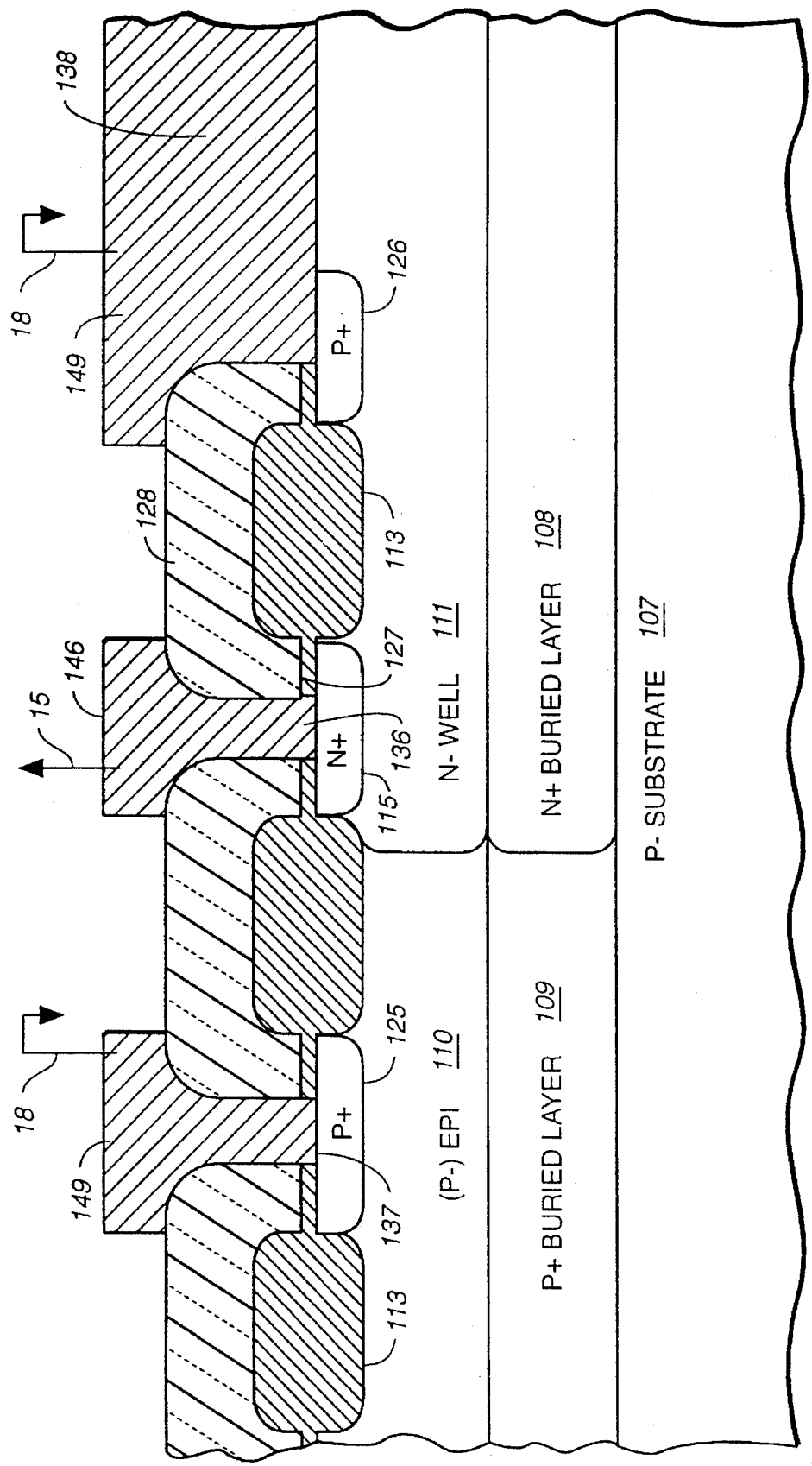
FIG._9

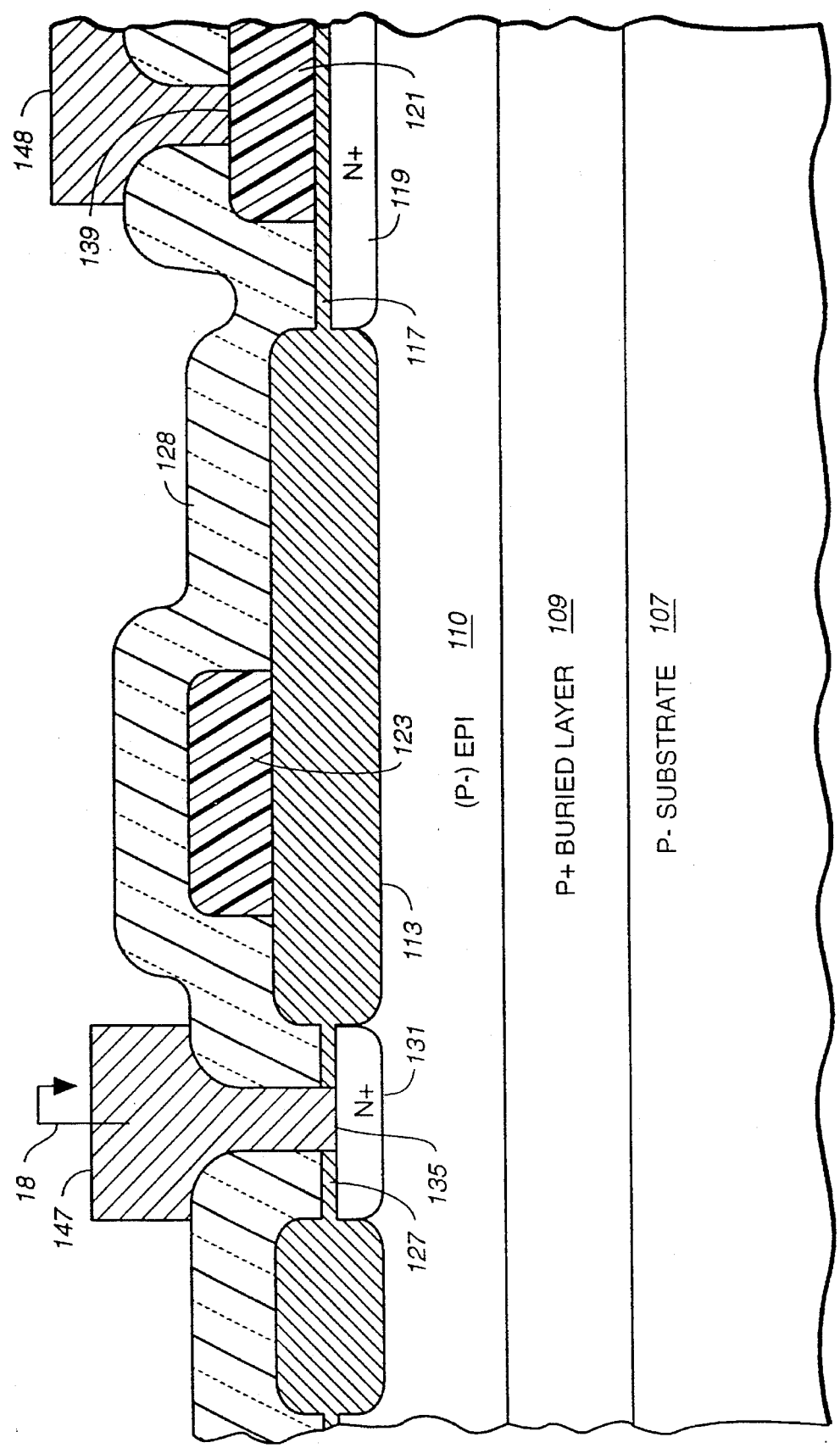
FIG._10

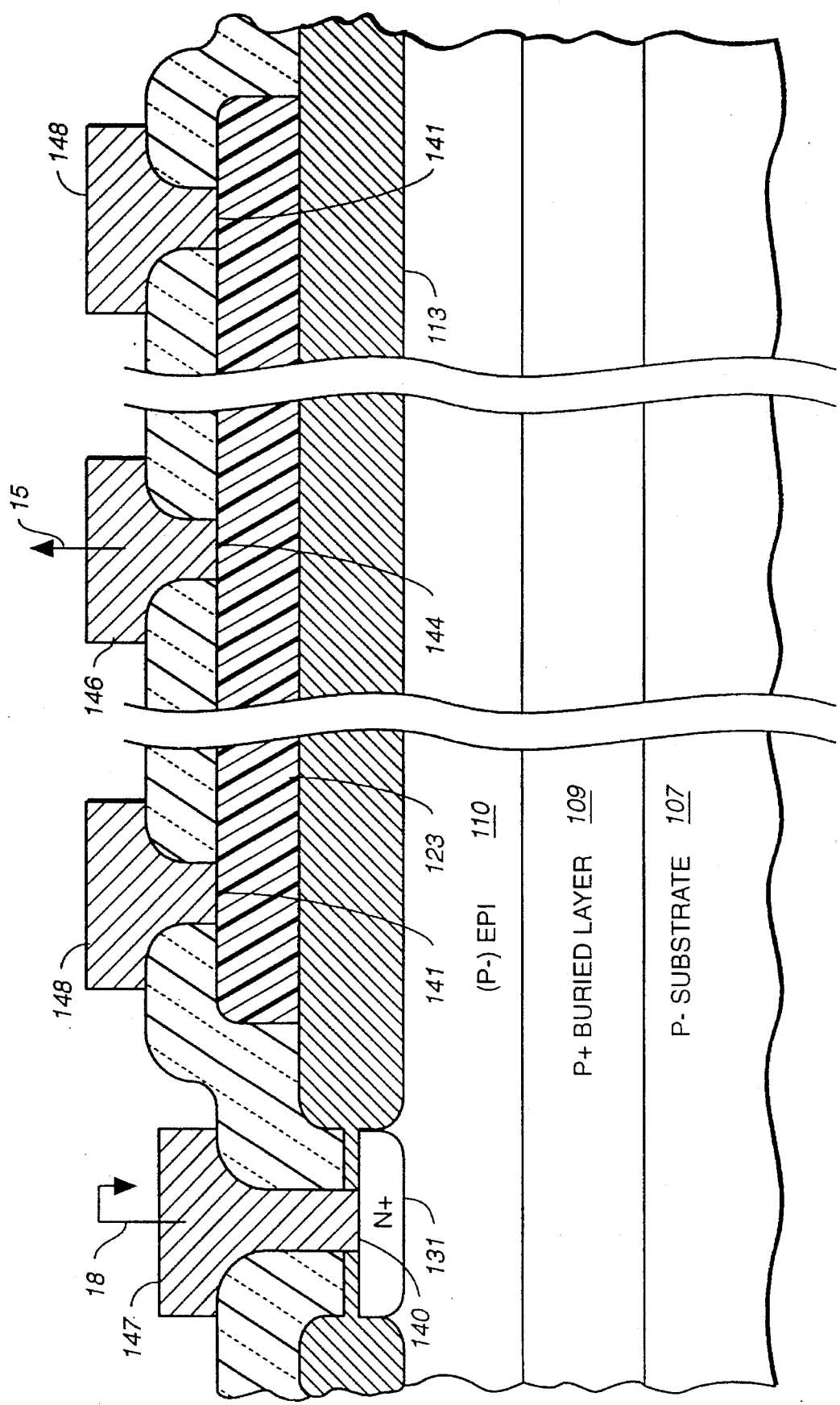
FIG._11

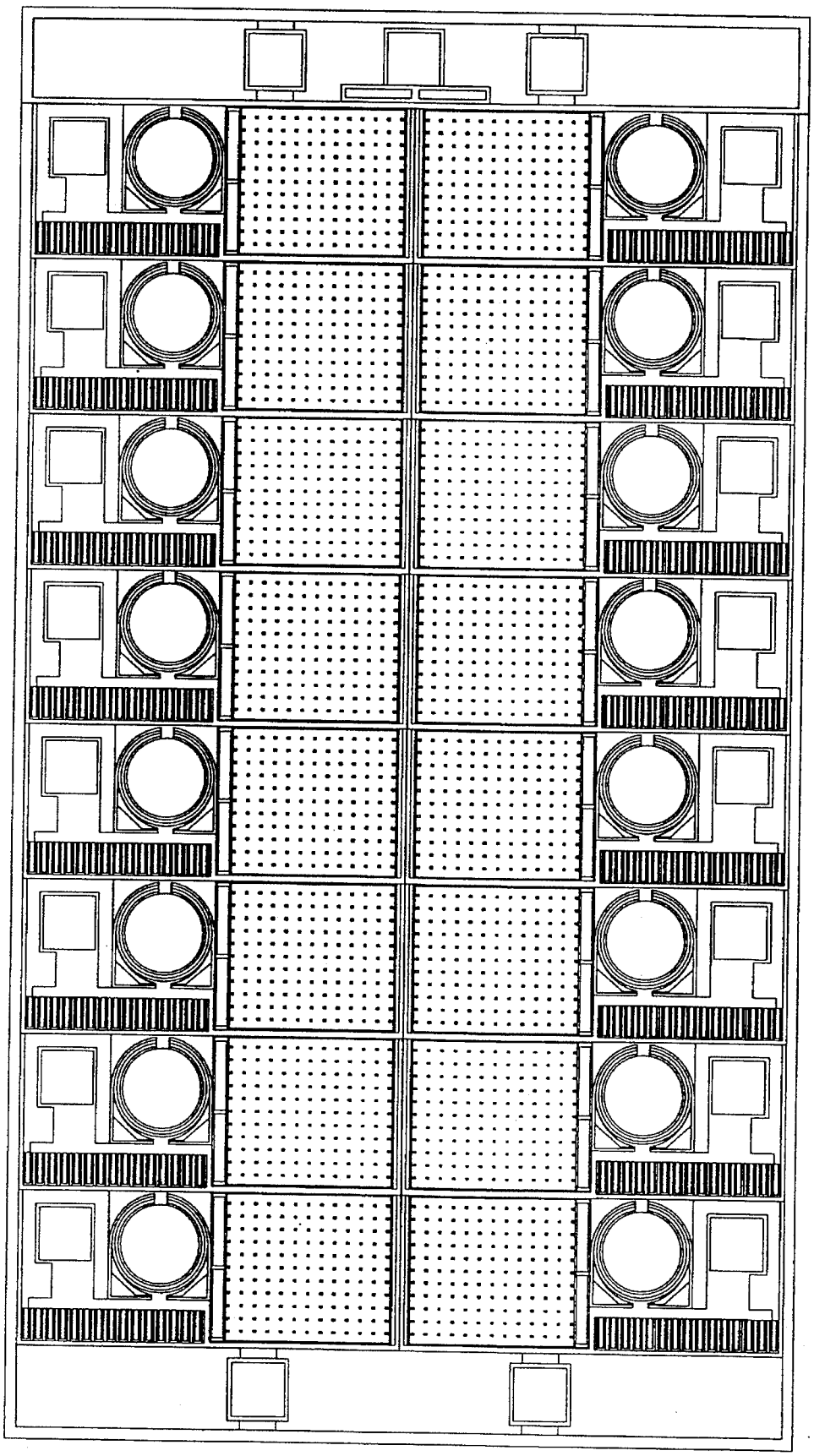
FIG._12

METHOD OF MAKING A SEMICONDUCTOR DEVICE WITH INTEGRATED RC NETWORK AND SCHOTTKY DIODE

This is a continuation-in-part of application Ser. No. 08/025,600 filed Mar. 3, 1993, now U.S. Pat. No. 5,355,014.

FIELD OF THE INVENTION

The present invention relates generally to integrated semiconductor devices. In particular, it relates to semiconductor devices having resistor and capacitor (RC) networks integrated with Schottky diodes on a single semiconductor substrate.

BACKGROUND OF THE INVENTION

In the past, RC networks and Schottky diodes have been used together in filter circuits. Such filter circuits are typically used to reduce electromagnetic and radio frequency interference (EMI/RFI) produced by computers and computer accessories.

These computers and accessories are routinely operated only a short distance away from telecommunication equipment. For example, a personal computer is often operated in close proximity to a television set and computers in police cars are operated side by side with police communication gear. Many of these computers have high clock rates and digital signals whose rise and fall times are extremely short. In addition, many computer accessories operate at similarly high speeds. For example, memory cards, video accelerator cards, modems, fax boards, co-processor cards, and data compression hardware all operate at very high frequencies. As a result, the high speed data lines in these computers and accessories produce EMI/RFI.

Without additional counter measures, these popular and widespread computers and accessories would contaminate the air waves and interfere with communication equipment. For example, cordless telephones, cellular telephones, radios, televisions, and burglar alarms could all be affected. Furthermore, important non-communication equipment, like pacemakers or other medical equipment, could also be impacted.

Therefore, it is desirable to have counter measures which suppress the EMI/RFI produced by the high speed data lines in computers and computer accessories. However, it is also desirable that such counter measures are inexpensive, occupy little space, ensure proper testing, and produce only small delays.

In the past, several techniques have been used for shielding high speed data lines. However, these methods have not proven to be effective at optimizing cost, size, ease of testing, minimization of delays, and suppression of EMI/RFI.

One method has utilized metallic shielding with feed through capacitors coupled to the high speed data lines. However, this method is expensive. Furthermore, it is no longer feasible in light of the need for portable computers and computer accessories and the availability of light weight plastic enclosures.

Another method has been to simply use low pass integrated RC filters produced by thin film techniques. The use of a resistor in series with a capacitor limits the maximum attenuation at higher frequencies to a constant value. However, such filters do not effectively suppress EMF/RFI produced by signal ringing on a transmission line.

Signals generally travel from one side of a transmission line to the other side. If the circuitry at the other end does not match the characteristic impedance of the transmission line, some of the signal amplitude can be reflected. This reflected signal can have the same or opposite polarity, depending on whether the mismatch is because of lower or higher impedance. As a result, signal ringing with undershoots or overshoots will occur. This signal ringing contributes to the radiation, of EMI/RFI.

Negative undershoots are more likely to occur than positive overshoots. This is due to the fact that, in semiconductor technology, n-channel MOS transistors and NPN bipolar transistors are faster, more powerful, and therefore more commonly used than p-channel MOS transistors and PNP bipolar transistors.

To suppress signal ringing with undershoots, Schottky diodes can be connected in parallel with a low pass RC filter. The cathode of the diode is connected to the transmission line and the anode is connected to ground. For normal signal levels on the transmission line, the Schottky diode is reverse biased and does not conduct current. However, negative undershoots exceeding the forward diode knee voltage are clamped and limited in amplitude.

A Schottky diode is more effective than a regular junction diode at suppressing negative undershoots for two reasons. First, it has a lower knee voltage and therefore limits undershoots to a smaller amplitude. In other words, it suppresses ringing to a greater extent than does a junction diode. And second, unlike the junction diode, the Schottky diode has no carrier storage and therefore provides for a clean signal clipping of high frequency ringing.

In the past, Schottky diodes have only been used as discrete circuit elements in these filter circuits. Because of this, these filter circuits are costly to produce, occupy a great deal of space, require extra connections for testing, and have significant delays due to large spacing between elements.

Although Schottky diodes have been used as collector-base clamping diodes in Schottky-TTL technology, to date, they have not been integrated with RC networks on a single integrated circuit chip. This stems from the difficulty in producing such a chip by combining the techniques used for forming RC networks with the techniques used for forming Schottky diodes.

OBJECTS OF THE INVENTION

It is an object of the invention to provide an integrated semiconductor device which has an RC network integrated with a Schottky diode.

It is another object of the invention to provide an integrated semiconductor device for reducing EMF/RFI which has an RC network integrated with a Schottky diode.

It is still another object of the invention to provide an integrated semiconductor device which is cost effective to produce and which has an RC network integrated with a Schottky diode.

It is further an object of the invention to provide an integrated semiconductor device which occupies a minimum amount of space and which has an RC network integrated with a Schottky diode.

It is still further an object of the invention to provide an integrated semiconductor device which can be tested as one entity without requiring connections of discrete elements and which has an RC network integrated with a Schottky diode.

It is yet another object of the invention to provide an integrated semiconductor device which has minimal delays due to the proximity of the circuit elements and which has an RC network integrated with a Schottky diode.

SUMMARY OF THE INVENTION

The foregoing and other objects of the invention may generally be achieved by a semiconductor device which has a resistor, a capacitor, and a Schottky diode all formed on a single semiconductor substrate. The resistor and the capacitor are coupled together in series. The Schottky diode is coupled in parallel to this in series connection.

In the substrate is formed a first doped region so as to define a first plate of the capacitor. A dielectric region is formed above the first doped region so as to define a dielectric portion of the capacitor. Above the dielectric region is formed a first conductive region so as to define a second plate of the capacitor. A second conductive region is formed above and in contact with the first conductive region.

A resistive region defines the resistor. A third conductive region is integrally formed with and connected to the second conductive region and is also in contact with the resistive region so as to define a first terminal of the resistor and to couple the first terminal of the resistor to the second plate of the capacitor. A fourth conductive region is formed to be in contact with the resistive region so as to define a second terminal of the resistor.

A doped well is formed in the substrate. In the doped well is formed a second doped region so as to define a cathode of a Schottky diode. A fifth conductive region is formed to be in contact with the second doped region and is integrally connected to the fourth conductive region so as to couple the second terminal of the resistor to the cathode of the Schottky diode. A sixth conductive region is formed to be in contact with the doped well so as to define an anode of the Schottky diode.

BRIEF DESCRIPTION OF THE DRAWINGS

The foregoing and other objects of the invention will become apparent in reading the following detailed description and in reference to the following drawings, in which:

FIG. 1 shows a general circuit schematic of the present invention;

FIG. 2 shows a layout of the present invention employing inter-digitized Schottky contact area;

FIG. 3 shows a layout of the present invention employing a single circular Schottky contact finger;

FIG. 4 shows a layout of the present invention employing a resistor comprising a Pa-type well formed in an N-type tub;

FIG. 5 shows a layout of the present invention employing a resistor comprising a thin film material;

FIG. 6 shows a general circuit schematic of a another embodiment of a semiconductor device in accordance with the present invention;

FIG. 7 provides a top view layout of the semiconductor device of FIG. 6;

FIG. 8 provides a cross sectional view of the electrostatic discharge protection device of FIG. 7 along the line 8a–8b through the section between 8c and 8d of FIG. 7;

FIG. 9 provides a cross sectional view of the Schottky diode of FIG. 7 along the line 9a–9b through the section between 9c and 9d of FIG. 7;

FIG. 10 provides a cross sectional view of the capacitor and resistor along line 8a–8b through the section between 10a and 10b of FIG. 7;

FIG. 11 provides a cross sectional view of the resistor along line 11a–11b of FIG. 7; and FIG. 12 provides a top view of another layout of device of FIG. 7.

DESCRIPTION OF THE PREFERRED EMBODIMENT

FIGS. 1–5 illustrate a semiconductor device 10 in accordance with the present invention. In these figures, like components are designated by like numerals.

FIG. 1 provides a general circuit schematic of the semiconductor device 10. The Schottky diode 11 is coupled in parallel to resistor 12 and capacitor 13. Resistor 12 and capacitor 13 are coupled in series.

The cathode 14 of Schottky diode 11 is coupled to the input terminal 15 and to the terminal 16 of resistor 12. The anode 17 of Schottky diode 12 is coupled to the ground terminal 18 and to the terminal 19 of capacitor 13. The terminal 20 of capacitor 13 is coupled to the terminal 21 of resistor 12.

FIG. 2 provides a cross sectional layout of the preferred embodiment of the semiconductor device 10. The layout shows the Schottky diode 11, the resistor 12, and the capacitor 13 formed into a monolithic integrated circuit on a single semiconductor substrate 24. The following discussion details the processes, the materials, and the connections used in producing this layout.

The substrate 24 is a P-type silicon material having a bulk resistivity of approximately 25–50 ohm cm. A lightly doped N-type tub 26 is then formed in the P-type substrate by implanting and/or diffusing a suitable impurity. In the preferred embodiment this impurity is phosphorous with a doping concentration of approximately $1 \times 10^{12}$ $cm^{-3}$. The N-tub 26 extends approximately 4 μm into the P-type substrate 24.

A dielectric material is then selectively grown on the substrate 24 by conventional techniques for providing field isolation. In the preferred embodiment this material is silicon dioxide and is grown to have a thickness of approximately 1.3 μm. The resulting field oxide regions 27–33 provide the field isolation.

Heavily doped $P^+$-type wells 34–37 and heavily doped $N^+$-type wells 39–42 are then formed by conventional techniques used for implanting impurities. In the preferred embodiment, the $P^+$-type wells 34–37 are formed by implanting boron into the N-type tub 26 with a doping concentration of approximately $1 \times 10^{14}$ $cm^{-3}$. The $P^+$-type wells 34–37 extend approximately 0.5 μm into the N-type tub 26. Also, in the preferred embodiment, the $N^+$-type wells 39–42 are formed by implanting arsenic with a doping concentration of approximately $1 \times 10^{16}$ $cm^{-3}$. The $N^+$-type wells 39–42 extend approximately 0.3 μm into the N-type tub 26.

Another dielectric material such as silicon dioxide is then grown across the entire surface of the substrate 24. This layer is grown to have a thickness of approximately 0.2 μm. This layer is then selectively etched so that a first metal layer can be deposited onto selected areas of the N-type tub 26, the N⁺-type wells 39–42, and the P⁺-type wells 34–37. The remaining regions of this oxide layer are the oxide strips 45–57.

After the second oxide layer is etched, the first metal layer is deposited across the entire surface. In the preferred embodiment, this metal layer is aluminum and is deposited with a thickness of approximately 1 µm. This first metal layer is then selectively etched to form the metal regions 61–67.

A suitable dielectric material is then deposited across the entire surface. In the preferred embodiment, this dielectric layer is silicon nitride and is deposited with a thickness of 0.2 µm. This dielectric layer is then selectively etched so that a second metal layer can be deposited onto the dielectric itself and onto the metal regions 61–67. The regions which remain are the dielectric regions 69–76.

After the dielectric layer is etched, the second metal layer is deposited across the entire surface. In the preferred embodiment, this metal layer is also aluminum and is also deposited with a thickness of approximately 1 µm. This second metal layer is then selectively etched to form the metal regions 79–84.

The resistor 12 primarily includes the N⁺-type well 39. This N⁺-type region has an area of approximately 30 µm by 30 µm and is in contact with the metal regions 62 and 63. The terminal 21 of resistor 12 is at the point where metal region 62 contacts the N⁺-type well 39. The terminal 16 of resistor 12 is at the point where metal region 63 contacts the N⁺-type well 39. Both contact points (i.e. terminals 16 and 21) are approximately 2.5 µm in width and approximately 20 µm apart from each other.

The capacitor primarily includes the metal region 79, the dielectric region 69, and the metal region 61. Each of these regions has an area of approximately 350 µm by 350 µm. The terminal 19 of capacitor 13 is formed by the metal region 61 and is coupled to the ground terminal 18. The terminal 20 of capacitor 13 is formed by the metal region 79.

The metal region 79 of capacitor 13 is coupled to the metal region 62. This is done with the via 78 of the metal region 79. Thus, the terminal 20 of capacitor 13 is coupled with the terminal 21 of resistor 12.

The Schottky diode primarily includes the metal regions 64, 66, 81 and 83, the N-type tub 26, the P⁺-type wells 34–37, and the N⁺-type wells 40–42.

The anode 17 of the Schottky diode is formed by the two parallel contact areas 86 and 87 where the metal regions 64 and 66 respectively contact the N-type tub 26. These parallel active areas 86 and 87 are approximately 8 µm in width and 320 µm in length. Thus, they form a set of interdigitized Schottky contact fingers 86 and 87.

The metal region 64 also contacts the P⁺-type wells 34 and 35 and the metal region 66 also contacts the P⁺-type wells 36 and 37. The resulting contact fingers 89–92 are each approximately 1 µm in width and 320 µm in length and are parallel to each other and to the active contact areas 86 and 87.

The P⁺-type wells 34–37 are used to increase the reverse breakdown voltage of the Schottky diode 11. The P⁺type wells 34 and 35 reduce the electric field between the N⁺-type wells 40 and 41 and the metal region 64. The P⁺-type wells 36 and 37 reduce the electric field between the N type wells 41 and 42 and the metal region 66. As a result, the paths for reverse breakdown between the metal region 64 and the N⁺-type wells 40 and 41 and the paths between the metal region 66 and the N⁺-type wells 41 and 42 are increased. Therefore, a greater reverse voltage is required for a reverse breakdown.

Another advantage to the P⁺-type regions is that the forward knee voltage can be tailored to meet specific needs. This is done by increasing or decreasing the doping concentrations of the P⁺-type wells 34–37.

In order to couple the metal regions 64 and 66 of the Schottky diode 11 to the ground terminal 18, the metal regions 81 and 83 are employed. The metal regions 81 and 83 therefore respectively serve as vias for coupling the parallel active contact areas 86 and 87 of the anode 17 to the ground terminal 18.

The cathode 14 of the Schottky diode 11 is formed by the multiple contact areas 94–96 where the N⁺-type wells 40–42 contact the N-type tub 26. The resulting contact fingers 94–96 have each a width of approximately 4 µm and a length of approximately 320 µm and are parallel to each other and to the active area contact fingers 86 and 87. The N⁺-type wells 40–42 are used for contacting the N-type tub 26 because a direct metal contact to the N-type tub 26 would establish another Schottky contact area.

The field oxide regions 29–33 together with the P⁺-type wells 34–37 provide separation between the active contact areas 86 and 87 and the N⁺-type wells 40–42. The field oxide regions 29–32 are each approximately 2 µm in width and 320 µm in length and are parallel to the active contact fingers 86 and 87. The P⁺-type wells 34–37 are each approximately 3 µm in width and 320 µm in length and are parallel to the active contact fingers 86 and 87 and the field oxide regions 29–32. Thus, the separation between each of the contact fingers 86 and 87 and one of the N⁺-type wells 40–42 is approximately 5 µm in width and 320 µm in length. In order to reduce the resistance between the active areas 86 and 87 and the N⁺-type wells 40–42, this separation could be made even smaller. However, this would have the undesirable effect of reducing the reverse breakdown voltage.

The metal region 63 is used in order to couple the N⁺-type well 40 of the Schottky diode 11 to the N⁺-type well 39 of the resistor 12. The contact area at each of the N⁺-type wells 39 and 40 is approximately 2.5 µm in width. Thus, the metal region 63 couples the contact area 94 of cathode 14 with terminal 16 of the resistor 12.

Furthermore, the metal region 80 is used to couple both the N⁺-type well 40 of the Schottky diode 11 and the N⁺-type well 39 of the resistor 12 to the input terminal 15. The metal region 80 therefore serves as a via for coupling the contact area 94 of cathode 14 to the input terminal 15.

The metal regions 65, 67, 82, and 84 are used in order to couple the N⁺-type wells 41 and 42 of the Schottky diode 11 to the input terminal 15. The metal regions 65 and 67 respectively contact the N⁺-type wells 41 and 42 at the contact areas 95 and 96. The width of both of these contact areas is approximately 2.5 µm. Furthermore, the metal regions 82 and 84 respectively contact the metal regions 65 and 67 at a width of approximately 2.5 µm. Thus, the metal regions 82 and 84 serves as vias for coupling the contact areas 95 and 96 of cathode 14 with the input terminal 15.

The field oxide region 28 provides separation between the N-type tub 26 and the N⁺-type well 39 and between the N⁺-type well 40 and the N⁺-type well 39. Since the field oxide region 28 is approximately 5.5 µm in width, the separation between the two N⁺-type wells 39 and 40 is approximately this same width. Furthermore, the separation between the N⁺type well 39 and the N-type tub 26 is approximately 3.5 µm.

The Schottky diode 11 can be configured to draw more current. This is done by making the width of the active contact areas 86 and 87 larger. However, as this width is increased, the associated capacitance at the active contact area is also increased.

In order to remedy such a problem and still provide the Schottky diode 11 with the capability to draw more current, additional parallel Schottky contact fingers can be constructed in the same manner as the contact finger 87. This also requires constructing associated additional $N^+$-type to N-type contact fingers in the same manner as the contact fingers 95 and 96.

As is shown in FIG. 2, the metal regions 79–84 contact the metal regions 61–67 respectively. The metal regions 79–84 do not directly contact the $N^+$-type wells, $P^+$-type wells 34–37, or the N-type tub 26. If this were attempted, undesirable inaccuracies would result from having to etch through both the silicon nitride layer and the second silicon dioxide layer deposited during fabrication.

FIG. 3 provides an alternative embodiment of the semiconductor device 10. In this embodiment, the Schottky diode 11 only has a single Schottky active contact area 86 rather than the set of inter-digitized Schottky contact areas 86 and 87 of FIG. 2.

The single active contact area 86 is circular shaped. Thus, the metal regions 64 and 81 are circular shaped as well. Furthermore, the $N^+$-type well 40, the field oxide region 29, the oxide strips 48–50, and the $P^+$-type 34 region are all ring shaped. Thus, the $N^+$-type to N-type contact area 94 is ring shaped as well. In addition, the metal region 63 has a ring shaped portion 97 which contacts the ring shaped $N^+$-type well 40. And, the metal region 81 has a ring shaped portion 98 which contacts the ring shaped portion of the metal region 63. The same type of process is used in fabricating this embodiment as was described earlier for the embodiment in FIG. 2.

FIG. 4 provides another embodiment of the semiconductor device 10. In this embodiment, the resistor includes a second N-type tub 25 formed in the P-type substrate 24. And, in the N-type tub 25, there is formed a $P^+$-type well 99. The metal regions 62 and 63 both contact the $P^+$-type well 99. These contacts form the two terminals 21 and 16 of the resistor 12. Otherwise, the connections and the components are the same as in the earlier described embodiment in FIG. 2.

In this embodiment, the second N-type tub 25 is formed at the same time using the same processes and materials as was described earlier for the N-type tube 26. Furthermore, the $P^+$-type well 99 is formed at the same time using the same processes and materials as was described earlier for the $P^+$-type wells 34–37. Otherwise, the fabrication process is the same as that described earlier for the embodiment in FIG. 2.

FIG. 5 shows still another embodiment of semiconductor device 11. In this embodiment, the resistor 12 includes the thin film resistive material 23 deposited on the field oxide region 27. The metal regions 62 and 63 both contact the thin film material 23. These contacts form the two terminals 21 and 16 of the resistor 12. Otherwise, the connections and the components are the same as in the earlier described embodiment in FIG. 2.

In this embodiment, the thin film material 23 is deposited onto the field oxide region 27 after the field oxide regions 27 and 29–32 have been formed and after the oxide strips 45 and 47 have been formed. In the preferred embodiment this film material comprises tantalum and is deposited with a thickness of approximately 1 μm. Then, the first metal layer is deposited and the metal regions 61–67 are formed. Otherwise, the fabrication process is the same as that described earlier for the embodiment in FIG. 2.

FIG. 6 provides a general circuit schematic of another semiconductor device 100 similar to semiconductor device 10. The Schottky diode 11, resistor 12, and capacitor 13 of semiconductor device 100 are all coupled in the circuit schematic of FIG. 6 in the same way as was described earlier for semiconductor device 10.

However, semiconductor device 100 includes a transistor based electrostatic discharge (ESD) protection device 101, though other electrostatic discharge protection devices well known to those skilled in the art may be used.

Typically, the thin dielectric of a capacitor, such as capacitor 13 in both FIGS. 1 and 6, can only withstand voltages of approximately 300 volts or less without substantially increasing the risk of product damage to the dielectric material. During handling of the semiconductor device 100, the input terminal 15 may see electrostatic discharge voltages of up to 10 KV. So, to protect the capacitor dielectric and the other sensitive structures of the present invention, the ESD device 101 shunts the electrostatic discharge to ground.

In the preferred embodiment of the present invention, the ESD device 101 comprises two inter-digitized $N^+$ comb structures located in the lower left quadrant of the semiconductor device 100 shown in FIG. 7. The even $N^+$ fingers of the first of these $N^+$ comb structures, such as $N^+$ finger 132 of FIG. 8, are connected to the input terminal 15 while the odd $N^+$ fingers of the second of the $N^+$ comb structures, such as $N^+$ fingers 131 of FIGS. 8 and 10, are connected to the ground terminal 18. During normal operation, the even and odd $N^+$ fingers create $N^+/P^-$ diodes with the $P^-$ epitaxial substrate layer 110 of FIG. 8 (i.e., when there is no voltage overload caused by an ESD event) and are reverse biased and have no effect.

During negative ESD events, the voltage at the even fingers will rise beyond the $N^+/P^-$ junction breakdown voltage, and an avalanche or other breakdown will occur. This breakdown current acts also as a base current for the parasitic NPN bipolar transistor created by the odd and even $N^+$ fingers and $P^-$ epitaxial substrate layer 110. The breakdown causes the parasitic NPN transistor to turn on and shunt any further increase of the ESD discharge to ground through normal bipolar transistor conduction. This minimizes any further and potentially destructive breakdown of the dielectric or other sensitive components of the semiconductor device 100 of the present invention.

FIG. 7 provides a top view of one layout of semiconductor device 100. The layout shows the Schottky diode 11, the resistor 12, the capacitor 13, and ESD protection device 101, all formed into a monolithic integrated circuit. The following discussion details the processes, the materials, and the connections used in producing this layout.

FIGS. 8–11 provide different cross sectional views of the semiconductor device 100 shown in FIG. 7. Specifically, FIG. 8 provides a cross sectional view of the ESD protection device 101 along line 8a–8b and through the section between 8c and 8d of FIG. 7. FIG. 9 provides a cross sectional view of the Schottky diode 11 along line 9a–9b through the section between 9c and 9d of FIG. 7. FIG. 10 provides a cross sectional view of the capacitor 13 and resistor 12 along line 8a–8b through the section between 10a and 10b of FIG. 7. FIG. 11 provides a cross sectional view of the resistor 12 along line 11a–11b of FIG. 7. FIG. 12 provides a top view of another layout of device 100 of FIG. 7.

Turning to FIG. 7, pad 103 serves as the input terminal for semiconductor device 100. Pad 103 is electrically connected to the cathode 14 of Schottky diode 11, resistor 12, and to the ESD protection device 101 through metal layer 146. Resistor 12 is also electrically connected to the capacitor 13 through metal layer 148. The capacitor and the ESD protection device 101 are also connected to the ground terminal 18 though the metal layer 147. The anode 17 of the Schottky diode 11 is connected to the ground terminal 18 through the metal layer 149.

As shown in FIGS. 8–11, semiconductor device 100 includes a base substrate layer 107. The base substrate layer 107 is a P⁻silicon material doped with a suitable impurity. In the preferred embodiment, the base substrate layer 107 has a bulk resistivity of approximately 25–50 ohm cm and is doped with boron.

The cylindrical shaped heavily doped $N^+$ buried region 108 of the Schottky diode 11 shown in FIG. 9, and the $P^+$ buried region 109 surrounding the $N^+$ buried region, shown in FIGS. 8–11, are formed by implanting or diffusing suitable impurities in the base substrate layer 107 using conventional techniques. The surrounding $P^+$ buried region 109 inhibits lateral diffusion of the $N^+$ region 108 during subsequent steps in fabricating semiconductor device 100.

The $N^+$ and $P^+$ buried regions 108 and 109 are preferably formed by first growing a base oxide layer, such as silicon dioxide, over the entire base substrate layer 107. The base oxide layer is grown to a thickness in the range of approximately 350–450 Å.

Then, a nitride layer, such as silicon nitride, is deposited over the entire base oxide layer. The deposited nitride layer has a thickness in the range of approximately 1400–1550 Å.

The nitride and base oxide layers are patterned to provide a circular area over the base substrate layer 107 where the base oxide layer has a thickness in the range of approximately 100–300 Å. This is done using conventional photolithographic and etching techniques.

The $N^+$ region 108 is then formed by implanting arsenic in the base substrate layer 107 at a doping concentration of approximately $3 \times 10^{15}$ cm$^{-3}$. The cylindrical shaped $N^+$ buried region 108 extends approximately 1.5 to 2.0 µm into the base substrate layer 107 and has a diameter of approximately 83 µm.

It should be noted that FIGS. 8–11 are not to scale, because to do so would obliterate important features. To show sufficient detail for the purpose of this patent, substantial liberties have been taken with the scale. For example, a 2.0 µm layer would scarcely be visible in comparison to artifacts, such as the polysilicon resistive materials discussed below, which measure two orders of magnitude larger in size. Accordingly, reference should be made to this specification to determine the actual approximate sizes of the artifacts discussed herein.

The photoresist mask used in patterning the nitride and base oxide layers is then stripped and the $N^+$ buried region 108 is oxidized/annealed. A masking oxide layer is then grown over the entire base substrate layer 107 using conventional techniques. This masking oxide layer has a thickness over the $N^+$ buried region 108 in the range of approximately 4700–5300 Å, and does not grow over the $P^+$ region 109 due to the presence of the nitride layer. Then, the nitride layer is stripped, exposing the underlying base oxide layer in the $P^+$ region 109.

The $P^+$ region 109 is then formed by implanting boron in the base substrate layer through the exposed area of the base oxide layer at a doping concentration of approximately $1.5 \times 10^{13}$ cm$^{-3}$. The portion of the masking oxide layer over the $N^+$ region acts as a mask so that the resulting $P^+$ buried region 109 surrounds the $N^+$ buried layer 108. The $P^+$ buried region extends approximately 2 µm into the base substrate layer 107.

Referring to FIGS. 8–11, after the remaining portions of the base and masking oxide layers are etched away using conventional etching techniques, a lightly doped epitaxial substrate layer 110 is then grown over the entire base substrate using conventional techniques. The epitaxial substrate layer 110, base substrate layer 107, and the $N^+$ and $P^+$ buried regions 108 and 109 form the substrate of semiconductor device 100 upon which the active and passive artifacts are created. In the preferred embodiment, the epitaxial substrate layer 110 is grown to have a thickness of approximately 1.5 to 2.0 µm.

As shown in FIG. 9, the cylindrically shaped lightly doped $N^-$well 111 of the Schottky diode 11 is then formed by implanting or diffusing a suitable impurity in the epitaxial layer 110 using conventional techniques. In the preferred embodiment, conventional photolithographic and etching techniques are used to create a base oxide layer having a thickness in the range of approximately 100 to 300 Å. This base oxide layer may be silicon dioxide.

The $N^-$well 111 is then formed by implanting phosphorous in the base oxide layer at a doping concentration of approximately $5 \times 10^{11}$ cm$^{-3}$. The cylindrically shaped N-type well 111 extends approximately 3 to 4 µm through the epitaxial substrate layer 110, into the base substrate layer 107, and has a diameter of approximately 83 µm.

The active regions of the Schottky diode are then formed by first growing yet another base oxide layer over the entire epitaxial layer, and then depositing a nitride layer over this base oxide layer. Like the earlier described base oxide layers, this base oxide layer may be made of silicon dioxide, grown to a thickness in the range of approximately 350 to 450 µm. The nitride layer, similar to the earlier described nitride layers, may be silicon nitride and may have a thickness in the range of approximately 1375 to 1575 Å.

The nitride and base oxide layers are patterned to mask the active area of the exposed epitaxial layer 110. This is done using conventional photolithographic and etching techniques, with the exposed portion of the base oxide layer having a thickness in the range of approximately 100 to 300 Å in the exposed area after the nitride layer has been etched.

Next, the non-active regions in the P+buried region 109 are then defined by implanting boron in the non-active area of the epitaxial layer 110. After the non-active regions in the P+buried region have been defined and the photoresist has been stripped, an insulating field oxide layer 113 is formed over the entire surface of the semiconductor device 100. This field oxide layer 113 is formed in the areas where the base oxide region was left exposed after etching the nitride and stripping the photoresist. In the preferred embodiment of the present invention, the field oxide layer 113 comprises silicon dioxide and is grown to have a thickness in the range of 7000 to 7800 Å.

After the field oxide layer 113 has been formed, the portion of the thin oxide layer over the nitride layer is then etched and the resulting exposed nitride layer is stripped using conventional techniques. The remaining oxide region over the active area is then etched as well, using conventional techniques. After this is done, the field oxide layer 113 has a thickness greater than approximately 6000 Å, and the remaining oxide layer over the active areas has a thickness of less than approximately 20 Å.

The N⁺ regions 115, 119, 131, and 132 are next defined by conventional photolithographic techniques and suitable impurities are implanted or diffused in the epitaxial layer 110 using conventional techniques. The N⁺ regions 115, 119, 131, and 132 are preferably formed by first implanting phosphorous and then arsenic in the epitaxial layer in areas exposed after the photolithography step described above. In the preferred embodiment, the phosphorous is implanted at a dose of approximately $8 \times 10^{15}$ cm⁻³ and the arsenic is implanted at a dose of approximately $7 \times 10^{15}$ cm⁻³. Moreover, the resulting N⁺ regions 115, 119, 131, and 132 extend approximately 1.5 to 2.0 μm into the epitaxial layer.

After the formation of the N⁺ regions 115, 119, 131, and 132, the dielectric and conductive regions 117 and 121 of the capacitor, and the resistive region 123 of the resistor are formed using a modification of the techniques described above.

The formation of these regions is preferably done by first growing a thin gate oxide layer, such as silicon dioxide, over the entire surface of the semiconductor device. As a result, the gate oxide region 117 and an insulating oxide layer 127 are formed in the areas between the regions of the field oxide layer 113 having a thickness in the range of approximately 750 to 850 Å.

Following this step, a conductive layer, such as polysilicon, is deposited over the gate oxide layer 117 in a thickness in the range of approximately 4200 to 4600 Å. An N⁺ dopant is then implanted or diffused in the polysilicon layer using conventional process techniques. In the preferred embodiment, this is done by using a conventional N⁺ predeposition process where phosphorous oxychloride (POC13) is deposited on the polysilicon layer and then heated to a temperature in the range of approximately 800 to 1000 degrees C. As a result of this heating step, the polysilicon becomes doped with phosphorous. The doped polysilicon layer is then patterned using conventional photoresist and etching techniques to form the conductive region 121 of the capacitor and the resistive region 123 of the resistor.

The P⁺ regions 125 and 126 are then defined by conventional photolithographic techniques and formed by implanting or diffusing suitable impurities in the epitaxial substrate layer 110 using conventional techniques. In the preferred embodiment, the P⁺ regions 125 and 126 are formed by implanting boron in the epitaxial layer in the areas exposed following the photolithography process, at a dose concentration of approximately $1 \times 10^{13}$ cm⁻³. The P⁺ regions 125 and 126 extend approximately 0.3 to 0.6 μm into the epitaxial substrate layer 110.

After the P⁺ regions 125 and 126 are formed, the photoresist is stripped and an insulating glass layer 128, having a preferred thickness of about 8000 to 11,000 Å, is grown or deposited over the entire surface of the semiconductor device.

Using conventional photolithographic and etch techniques, surface contact areas 135–142 are defined through the insulating oxide layer 127 and the glass layer 128.

After contact areas 135–142 are formed, a metal layer is deposited over the entire surface. In the preferred embodiment, this metal layer is aluminum or an aluminum alloy including silicon and copper. This metal, is then patterned and etched using conventional photolithographic techniques to produce the metal regions 146–149.

After the metal regions 146–149 have been formed, the photoresist is stripped away and a passivation layer (not shown in the figures) is deposited over the entire surface. In the preferred embodiment, this passivation layer is either doped silicon dioxide or a combination of undoped silicon dioxide and silicon nitride. Using conventional photolithography and etch techniques, the passivation layer is patterned and etched so that the passivation layer covers the entire surface except for the pad region 103. After the photoresist has been stripped, the wafers receive a final furnace anneal at 400° to 450° C. in Forming gas.

As was indicated earlier, FIG. 8 shows in detail the inter-digitized odd N⁺ fingers 131 and even N⁺ fingers 132 of the N⁺ comb structures of the preferred embodiment of the ESD protection device 101 of FIG. 6. A series of these N⁺ fingers may be used, as illustrated in FIG. 7, and may be repeated as necessary or appropriate, given the amount of space available on the substrate and the nature of the ESD protection desired.

Metal regions 146 and 147 respectively have portions contacting the contact areas 135 and 136 of the N⁺ fingers 131 and 132. Surface contact areas 135 are preferably approximately 2.5 μm in width, and extend the length of the N⁺ fingers 131. Surface contact area 136 is preferably 2 μm in width, and extends the length of the N⁺ finger 132. The N⁺ fingers 131 are approximately 5.5 μm in width and 125 μm long. The N⁺ finger 132 is approximately 11 μm in width and 25 μm long. The N⁺ fingers 131 and 132 are separated by the regions of the field oxide layer 113 which are approximately 3 μm in width and extend the length of the N⁺ fingers 131 and 132.

FIG. 9 shows in detail the cross section of the preferred embodiment of the Schottky diode 11 of FIG. 7. The Schottky anode 17 is formed by the annular portion of the metal region 149 that contacts the N⁻well 111 at the contact area 138. Since the metal region 149 is coupled to the ground terminal 18, the anode 17 is also coupled to the ground terminal 18.

At the edge of the annular anode portion of metal region 149, where the contact area 138 ends, there is a non-homogenous electric field which could lead to undesirable leakage current. This unwanted side effect is limited by defining the edge of the Schottky diode area with the P+guard ring region 126, which is also contacted by the metal region 149. Using this geometry, the edge of the Schottky diode is defined by the P⁺/N⁻diode created by imbedding the P⁺ guard ring region 126 in the N⁻well 111. This P⁺/N⁻diode is electrically in parallel with the metal/ N⁻well diode. The P⁺/N⁻diode has a higher knee voltage, and therefore in forward direction will carry little, if any, current until the input voltage drop across the Schottky diode is high enough to overcome the knee voltage. The current flowing through the P⁺/N⁻diode has a slow transit time and a long reverse recovery time, all undesirable characteristics which lead to the choice of a Schottky diode instead of a regular junction diode. Therefore, one objective of this geometry is to minimize the area and thus the effect of the P⁺/N⁻junction diode. Because of its annular geometry, the Schottky diode 11 of the present invention has a maximal area with respect to its P+guard ring region 126.

The Schottky cathode 14 comprises the ring shaped N⁺ region 115 imbedded in the N⁻well 111 and the portion of the metal region 146 in contact with the N⁻well 111. Since the N⁻well 111 is relatively thin, just a few microns in thickness, current flow through the Schottky diode 11 of the present invention is from the metal/N⁻interface, through the thin N⁻well 111, along the more conductive N⁻buried layer 108, back up through the N⁻well 111 below the N⁺ region 115, and then through the metal region 146. Because of the P⁺ guard ring 126, the distance between the Schottky anode 17 and the cathode 14 is much greater than the traverse through the N⁻well 111 to the N⁺ buried layer 108.

The annular anode portion of metal region 149 and the ring shaped cathode portion of metal region 146 are separated by a ring shaped region of the glass layer 128. This ring shaped portion of the glass layer 128 is approximately 6 μm in diameter and encircles the annular anode portion of the metal region 146. Underlying the ring shaped portion of the glass layer 128 is a ring shaped region of the field oxide 113 which is also ring shaped and has a diameter of approximately 3 μm. These two ring shaped insulating regions electrically isolate the Schottky anode 17 from the cathode 14.

FIG. 10 shows the cross section of the capacitor 13 of the preferred embodiment of the present invention. The lower plate 19 of the capacitor comprises the conducting N⁺ region 119. Since, as shown in FIG. 11, the metal region 147 is coupled to the ground terminal 18 and contacts the N⁺ region 119 at the contact area 140, the N⁺ region 119 is coupled to the ground terminal 18 and to the odd N⁺ regions 131 of the ESD protection device 101. The gate oxide region 117 of the capacitor 13 forms the dielectric portion of the capacitor 13. The upper plate 20 of the capacitor 13 comprises the polysilicon region 121. The polysilicon region 121 is contacted by the metal region 148 at many contact areas 139, as shown in FIG. 7. These contact areas 139 are defined by many holes through the region of the glass layer 128 over the polysilicon region 121. This is done to minimize any effects of finite polysilicon sheet resistivity.

FIG. 11 shows the cross section of the resistor 12 of the preferred embodiment of the present invention. The resistor 12 comprises the polysilicon region 123. Since both ends of the polysilicon region 123 are contacted by the metal region 148 at the end contact areas 141, and the center of the polysilicon region 123 is contacted by the metal region 146 at the contact area 142, the resistor 12 comprises two back to back polysilicon strips, 157 and 159, as shown in FIG. 7. The two strips 157 and 159 are connected electrically in parallel. The dimensions of the strips 157 and 159 are chosen so that their parallel resistances yield the desired resistor value, given the sheet resistivity of the polysilicon region 123.

The contact of the metal region 148 at the contact areas 141 defines the terminal 21 of resistor 12 and the contact of the metal region 146 at the contact point 142 defines the other terminal 16 of the resistor 12. Thus, the metal region 148 couples the top plate 20 of the capacitor 13 to the terminal 21 of the resistor 12. And, the metal region 146 couples the terminal 16 of the resistor 12 to the cathode 14 of the Schottky diode 11, to the even N⁺ regions of the ESD protection, and the input terminal 15.

FIG. 12 shows multiple duplicates of the embodiment of FIGS. 6–12 onto a monolithic substrate.

While the present invention has been described with reference to a few specific embodiments, the description is illustrative of the invention and is not to be construed as limiting the invention.

For example, as was indicated earlier, there are many different ESD protection structures and methodologies that could be implemented in accordance with the present invention.

There are also a variety of different geometries that can be substituted for the annular geometry Schottky diode of the semiconductor device 100 of FIGS. 6–12. For example, the inter-digitized Schottky diode of FIGS. 1–5 could be used.

Moreover, there are many resistive materials that are well known and could be used in lieu of the polysilicon region 123 of the resistor 12 of FIGS. 6–12. For example, tantalum oxide may be used. Or, an N⁺ diffusion resistor of the type shown in FIGS. 2 and 3 may be used. In this case, the N⁺ resistive region is formed in the epitaxial substrate layer 110 during the same process in which the N⁺ regions 115, 119, 131, and 132 are formed.

Also, many geometries may be used in connection with the design of the capacitor 13 in accordance with the present invention.

Various other modifications may occur to those skilled in the art without departing from the true spirit and scope of the invention as defined by the appended claims.

What is claimed is:

1. A method of fabricating an integrated semiconductor device comprising the steps of:
   utilizing a substrate;
   forming a first doped region in said substrate so as to define a first plate of a capacitor;
   forming a dielectric region above said first doped region so as to define a dielectric portion of said capacitor;
   forming a first conductive region above said dielectric region so as to define a second plate of said capacitor;
   forming a resistive region defining a resistor;
   forming a second conductive region having a first portion above and in contact with said first conductive region and a second portion in contact with said resistive region so as to define a first terminal of said resistor and couple said first terminal of said resistor to said second plate of said capacitor; and
   forming a third conductive region in contact with said resistive region so as to define a second terminal of said resistor.

2. The method as recited in claim 1 further comprising the step of forming an insulating region over said first conductive region and said resistive region, said insulating region having a multiplicity of openings through which said first portion of said second conductive region contacts said first conductive region and at least one opening through which said second portion of said second conductive region contacts said resistive region.

3. The method as recited in claim 1 wherein said first conductive region comprises polysilicon and said second conductive region comprises metal.

4. The method as recited in claim 3 further comprising the step of forming an insulating region above said substrate wherein said resistive region is formed over said insulating region and comprises polysilicon.

5. The method as recited in claim 4 wherein said first conductive region and said resistive region are formed simultaneously.

6. The method as recited in claim 3 wherein said resistive region comprises a second doped region in said substrate.

7. The method as recited in claim 6 wherein said first and second doped regions are formed simultaneously.

8. The method as recited in claim 7 wherein said substrate comprises a P-type substrate and said first and second doped regions comprise N⁺-type regions.

9. The method as recited in claim 1 further comprising the steps of:
   providing an input terminal coupled to said third conductive region;
   providing a ground terminal coupled to said first doped region;
   providing an ESD protection device coupled between said input and ground terminals.

10. The method as recited in claim 9 wherein:

said substrate is doped and coupled to said ground terminal; and said step of providing said ESD protection device comprises the steps of:
forming a second doped region in said substrate oppositely doped to said substrate and coupled to said ground terminal; and
forming a third doped region in said substrate, adjacent said third doped region, oppositely doped to said substrate, and coupled to said input terminal.

11. The method as recited in claim 10 wherein:
said substrate is a P-type substrate; and
said first, second, and third, doped regions are N$^+$-type regions.

12. The method as recited in claim 1 further comprising the step of forming an insulating region above said substrate wherein said first conductive region and said resistive region comprise the same material.

13. The method as recited in claim 12 wherein said first conductive region and said resitive region are formed simultaneously.

14. The method as recited in claim 12 wherein said first conductive region and said resistive region comprise polysilicon and said second conductive region comprises metal.

15. A method of fabricating an integrated semiconductor device comprising the steps of:

providing a substrate;

forming a first doped region in said substrate so as to define a first plate of a capacitor;

forming a dielectric region above said first doped region so as to define a dielectric portion of said capacitor;

forming a first conductive region above said dielectric region so as to define a second plate of said capacitor;

forming a resistive region defining a resistor;

forming a second conductive region having a first portion above and in contact with said first conductive region and a second portion in contact with said resistive region so as to define a first terminal of said resistor and couple said first terminal of said resistor to said second plate of said capacitor;

forming a doped well in said substrate;

forming a second doped region in said doped well so as to define a cathode of a Schottky diode;

forming a third conductive region in contact with said resistive region so as to define a second terminal of said resistor and a second portion in contact with said second doped region so as to couple said second terminal of said resistor to said cathode of said Schottky diode; and forming a fourth conductive region in contact with said doped well so as to define an anode of said Schottky diode.

16. The method as recited in claim 15 wherein:
said step of providing a substrate comprises the steps of utilizing a base substrate layer, forming a doped buried region in said base substrate layer, and forming an epitaxial substrate layer above said base substrate layer;
said doped well is formed in said epitaxial substrate layer above said doped buried region;
said first doped region is formed in said epitaxial substrate layer; and
said second doped region is formed in said epitaxial substrate layer above said doped buried region;
wherein current flowing from said anode of said Schottky diode to said cathode of said Schottky diode flows through said doped buried region.

17. The method as recited in claim 16 wherein:

said base substrate layer comprises a P-type substrate layer;
said epitaxial substrate layer comprises a P-type substrate layer;
said doped well comprises an N-type well; and
said first, second, and buried doped regions comprise N$^+$-type regions.

18. The method as recited in claim 15 further comprising the steps of:
providing an input terminal coupled to said third conductive region;
providing a ground terminal coupled to said fourth conductive region and said first doped region;
providing an ESD protection device coupled between said input and ground terminals.

19. The method as recited in claim 18 wherein:
said substrate is doped and coupled to said ground terminal; and
said step of providing said ESD protection device comprises the steps of:
forming a third doped region in said substrate oppositely doped to said substrate and coupled to said ground terminal; and
forming a fourth doped region in said substrate, adjacent said third doped region, oppositely doped to said substrate, and coupled to said input terminal.

20. The method as recited in claim 19 wherein:
said substrate comprises a P-type substrate;
said doped well comprises an N-type well; and
said first, second, third, and fourth doped regions comprises N$^+$-type regions.

21. The method as recited in claim 15 further comprising the step of forming an insulating region over said first conductive region and said resistive region, said insulating region having a multiplicity of openings through which said first portion of said second conductive region contacts said first conductive region and at least one opening through which said second portion of said second conductive region contacts said resistive region.

22. The method as recited in claim 21 wherein said resistive region comprises a second doped region in said substrate.

23. The method as recited in claim 22 wherein said said first and second doped regions are formed simultaneously.

24. The method as recited in claim 23 wherein said substrate comprises a P-type substrate and said first and second doped regions comprise N$^+$-type regions.

25. The method as recited in claim 15 wherein said first conductive region comprises polysilicon and said second conductive region comprises metal.

26. The method as recited in claim 25 further comprising the step of forming an insulating region above said substrate wherein said resistive region is formed over said insulating region and comprises polysilicon.

27. The method as recited in claim 26 wherein said first conductive region and said resistive region are formed simultaneously.

28. The method as recited in claim 12 further comprising the step of forming an insulating region above said substrate wherein said first conductive region and said resistive region comprise the same material.

29. The method as recited in claim 28 wherein said first conductive region and said resistive region are formed simultaneously.

30. The method as recited in claim 28 wherein said first conductive region and said resistive region comprise polysilicon and said second conductive region comprises metal.

* * * * *